United States Patent [19]
Ho et al.

[11] Patent Number: 5,905,007
[45] Date of Patent: May 18, 1999

[54] METHOD FOR ALIGNING AND FORMING MICROELECTROMECHANICAL SYSTEMS (MEMS) CONTOUR SURFACES

[75] Inventors: Chih-Ming Ho, Palos Verdes; Wen J. Li, Torrance, both of Calif.

[73] Assignee: The Regents of the University of California, Oakland, Calif.

[21] Appl. No.: 08/904,729

[22] Filed: Aug. 1, 1997

[51] Int. Cl.$^6$ ...................................................... G03F 9/00
[52] U.S. Cl. ................................. 430/22; 430/5; 430/319
[58] Field of Search .................................. 430/22, 5, 319

[56] References Cited

U.S. PATENT DOCUMENTS

| | | | |
|---|---|---|---|
| 5,395,718 | 3/1995 | Jensen et al. | 430/5 |
| 5,552,249 | 9/1996 | Jensen et al. | 430/5 |
| 5,567,554 | 10/1996 | Jensen et al. | 430/5 |

OTHER PUBLICATIONS

"A Concentric Build–Up Process to Fabricate Pratical Wobble Motors" by H. Ogura, et al. IEEE (Jan. 1994), pp. 114–118.

"Scanning Electron Micrograph [Image](SEM) Image of a Microelectromechanical System (MEMS) Sensor After Active Laser Trimming" Revise, Inc. (Sep. 8, 1996).

"Frabrication of Submicrometer Features on Curved Substrates by Microcontact Printing" by Jackman et al. Science vol. 269 (Aug. 4, 1995), pp. 664–666.

"Features of Gold Having Micrometer to Centimeter Dimensions Can Be Formed Through a Combination of Stamping With an Elastomeric. . . " by Amit Kumar et al., Appl. Phys. Lett. 63(14) (Oct. 4, 1993), pp. 2002–2004.

"Fabrication of Micro–Structures Using Non–Planar Lithography (NPL)" by Stephen C. Jacobsen et al. MEMS (1993), pp. 45–50.

*Primary Examiner*—Christopher G. Young
*Attorney, Agent, or Firm*—Daniel L. Dawes

[57] ABSTRACT

An integrated circuit, or microelectromechanical structure is defined onto a contour surface by utilizing a flexible mask upon which photolithographic patterns are first defined using conventional planar photolithographic techniques. The contour surface is provided with a thin film uniformly distributed on the surface and then the flexible mask is aligned with the contour substrate. Alignments are made through multiple stages of yaw alignment, translation alignment and rotational alignment. Once the mask is aligned with contour substrate it is then subjected while rotating to developing field, such as uniform illumination of ultraviolet light shining on the side of the contour substrate as it is rotated in the illumination field. The developed photoresist layer disposed on the surface of the contour substrate is thus developed and the underlying film etched according to the patterned mask in a manner similar to a conventional planar photolithography. Multiple layers are thus disposed masked and etched to result in complex multilayered integrated circuit and/or microelectromechanical devices disposed on the contour surface of a macromechanical component or structure.

19 Claims, 4 Drawing Sheets

METHOD FOR ALIGNING AND FORMING MICROELECTROMECHANICAL SYSTEMS (MEMS) CONTOUR SURFACES

BACKGROUND OF THE INVENTION

1. Field of the Invention

The field relates to fabrication techniques and microelectromechanical systems (MEMS) and in particular to a methodology for fabricating MEMS systems on contour surfaces, such as cylinders.

2. Description of the Prior Art

Micron-sized mechanical structures cofabricated with electrical circuitry using conventional integrated circuit (IC) methodologies are called microelectromechanical systems or MEMS. In the past decade MEMS pressure sensors and accelerometers have realized commercial success due to the competitiveness in performance and cost in comparison to their conventional counterparts. Recently, a strong interest has risen in interfacing MEMS systems with macromechanical structures. The proposed application for integrating MEMS sensor networks into macromechanical parts include surface flow monitoring and control, condition based maintenance, environmental monitoring, process control, robotics and automation.

The possibility of controlling macromechanical components using MEMS actuators was demonstrated in 1994 by Ho et al., *Control of Macro Machine by Micro Actuators*, Bulletin of 47th Annual Meeting of the Division of Fluid Dynamics of the American Physical Society, Atlanta, Ga. (November 1994). In a wind tunnel experiment demonstrated by Ho, drag reduction was achieved by using MEMS actuators to reduce shear stress within the boundary layer of a flat plate. The University of Utah and Sarcos Research Corporation are currently developing packaging methods for MEMS pressure and vibration sensors combined with integrated circuits for underwater operation. The integrated sensor networks are to be implemented on a ⅛ scale version of a submarine fin. The Goodyear Tire & Rubber Company is also packaging MEMS sensors with radiofrequency transponders into truck tires for pressure sensing and revolution counting. To reduce payload weight, the satellite industry is also in need of a technology to incorporate integrated circuits with spacecraft mechanical structures.

Since IC process technology allows fabrication only on flat substrates, the MEMS structures must also reside on a flat chip. Thus, integration of these chips onto macromechanical components, which often have curved surfaces, becomes an issue which must be addressed. Typically, the bulk components are machined to accommodate the MEMS chips. The chips are then connected electronically by gold wires to complete the system. Other methods include for example fitting a completely hermetically sealed sensor and circuit system onto the machined parts. Thus the packaging of chips or systems onto mechanical components often change the contour of the bulk parts and this in turn requires precision machining.

A possible solution for packaging IC/MEMS devices onto macromechanical parts is to first fabricate the MEMS devices on a flexible skin, and then glue these skins onto mechanical parts. Obviously, these skins can be used to incorporate IC/MEMS devices onto conformal substrates without the need of developing a new technology. In fact, MEMS shear stress sensors have been built on lift-off polyimide films to alleviate the problem of machining the bulk parts. But MEMS and/or integrated circuits on flexible substrates are subject to some important limitations. One limitation is that the alignment of these skins to a desired orientation on the macromechanical component is in general a problem, which prevents low cost mass manufacturing. Another disadvantage is that this technique allows only the integration of surface micromachined devices onto the macrosubstrates, and does not allow the potential to bulk-micromachine a contour macrosubstrate. Also potentially interfering stresses caused by the glue and glue nonuniformity arise when attaching of these flexible skins onto a macromechanical substrate.

The patterning of simple, one-layer, micron-sized structures on cylinders has been performed by Ogura et al., "*A Concentric Build-Up to Fabricate Practical Wobble Motors*," IEEE 1994, 0-7803-1833-1/94 and Jacobsen, et al., "*Fabrication of Micro-Structures Using Non-Planar Lithography*," MEMS1993. Jacobsen patterned a 500 mm diameter rod with E-beam resulting in 10 micron line width resolution. Ogura did not disclose his patterning technique, but the rod was 1.0 mm in diameter with 30 micron line width resolution. Neither Jacobsen or Ogura disclose the procedure for aligning patterns of different layers of structures, which is critical for many integrated circuits and MEMS devices, such as is the case when fabricating transistors and the majority of existing MEMS devices.

A computer controllable laser system has been used to add silicon and deposit metals on the contour surfaces. Bloomstein and Ehrlich have developed a technique that deposit metals at approximately the rate of $2 \times 10^4$ pixels per second with 1 micron resolution. See for example Bloomstein et al., "*Laser-Chemical Three-Dimensional Writing for Microelectromechanics and Application to Standard-Cell Microfluidics*," J. Vac. Sci. Technology, B 10(6) Nov./Dec. 1992. Metal thicknesses greater than 10 micron are obtainable and line widths as small 0.2 microns are possible.

Revise, Inc. is currently marketing an apparatus based on Bloomstein and Ehrlich's work under the trademark, SiliconEditor, which can deposit and etch serially different metals, semiconductors and dielectric materials through laser deposition techniques. The materials include aluminum, platinum, tungsten, silicon, molybdenum, gold and copper. The SiliconEditor also accepts data from computer aided design software to control stage motions and laser operation. The methodology is similar to that described by Jacobsen and is similarly expensive and slow, which ill adapts it to mass fabrication.

Therefore, what is needed is a methodology that will allow the multilayered fabrication of complex IC/MEMS devices directly onto nonsilicon contour substrates. Specifically, what is needed is a methodology for using thin film deposition, photolithography, and alignment of the mask layers for nonsilicon cylindrical substrates for the purposes of multilayer structures.

BRIEF SUMMARY OF THE INVENTION

The invention is a method for fabricating micron-sized devices onto a contour surface comprising the steps of fabricating a patterned mask on a flexible substrate; disposing a photoresist layer onto the contour substrate; aligning the flexible mask conformally on the contour substrate; and exposing the mask and the photoresist on the contour substrate to a developing field of energy so that selected portions of the photoresist on the contour substrate are developed thereby transferring the pattern from the mask to the photoresist layer on the contour substrate.

By aligning the flexible mask conformally on the contour substrate, it is meant not only to possibly include yaw, translational and rotational alignment with underlying structures, but also to obtain contact with or appropriate radial positioning of the flexible mask onto the contour substrate. While the illustrated embodiment contemplates wrapping a flexible mask onto at least a portion of the surface of a cylinder, cone or other conic or prismatic three dimensional shape, it is within the scope of the invention that the flexible sheet can be conformed onto an arbitrarily shaped substrate.

The step of fabricating the mask comprises fabricating a patterned non-ultraviolet transparent layer on the flexible substrate. In the preferred embodiment the non-ultraviolet layer is a thin film of chromium disposed on the flexible substrate overcoated with a thin film of gold.

The step of disposing the photoresist layer on the contour substrate is in one embodiment by spray coating the photoresist onto the contour substrate. In another embodiment the step of disposing the photoresist on the contour substrate comprises electrodepositing or chemical vapor depositing a photoresist layer onto the contour substrate.

Where the contour substrate is cylindrical and is characterized by a longitudinal axis, the step of exposing the contour substrate to a developing field of energy comprises rotating the cylindrical contour substrate about the longitudinal axis while exposing the cylindrical contour substrate from a direction generally perpendicular to the longitudinal axis.

Whereas the steps described above is focused only on the deposition and patterning of a photoresist layer on a contour substrate, clearly the improvement also contemplates the further step of disposing a thin film on the contour substrate prior to disposing the photoresist onto the contour substrate. The photoresist is thereafter disposed on the thin film and used to pattern it.

The thin film may be spray coated onto the contour substrate, electroplated onto the contour substrate, or vapor/plasma deposited onto the contour substrate. In general however the thin film may be disposed on the substrate, the substrate is preferably rotated while the film is being deposed.

The steps of aligning the flexible mask to the contour substrate is comprised of yaw, axially and longitudinally aligning the mask to the contour substrate. The flexible mask is temporarily affixed to the substrate after is yaw aligned. The mask is then longitudinally and axially aligned to the substrate. Yaw aligning the mask to the substrate is performed in a first yaw alignment system and longitudinally and axially aligning the mask to substrate is performed in a second alignment system with two-degrees of freedom. Yaw aligning is performed prior to longitudinally and axially aligning the mask to the contour substrate in the second alignment system. Yaw aligning the contour surface relative to the flexible mask comprises aligning the contour substrate to a predetermined alignment indicia on the flexible mask. The contour substrate is longitudinally aligned to the indicia position on the flexible mask by rotation of the contour substrate about an axis parallel to the plane of the mask. The flexible mask is axially aligned relative to the contour substrate by translating the flexible mask about the axis of rotation of the contour substrate.

The invention is also defined as a method for fabricating an integrated circuit/microelectromechanical (IC/MEMS) structure on a surface of a cylindrical substrate comprising the steps of disposing a thin film on the surface of the substrate by rotating the cylindrical substrate while the thin film is disposed thereon. An aligned pattern is provided on the thin film of the substrate. The aligned pattern on the thin film of the substrate is exposed to ultraviolet light while rotating the cylindrical substrate to selectively define the IC/MEMS structure in the thin film on the cylindrical substrate surface.

The invention now having been briefly summarized can be better visualized by turning to the following drawings wherein like elements are referenced by like numerals.

The invention in its various embodiments now having been illustrated in the foregoing drawings, turn to the following detailed description of the invention and its embodiments.

DETAILED DESCRIPTION OF THE PREFERRED EMBODIMENTS

To successfully fabricate a MEMS device or structure on a contour surface practical, low cost and micron-controllable techniques have to be developed for contour surfaces for the photolithography, the deposition of thin films on the contour surface, and alignment of the multilayered patterns on the contour surface. This has been achieved in the present application in the manner described in the illustrative embodiment of a cylinder as follows. The principles, however, can be adapted consistent with the teachings of the invention to other more complex contour surfaces and combinations of method steps for fabrication of integrated circuits and/or MEMS structures or devices.

An IC, or microelectromechanical structure is defined onto a contour surface by utilizing a flexible mask upon which photolithographic patterns are first defined using conventional planar photolithographic techniques. The contour surface is provided with a thin film uniformly distributed on the surface and then the flexible mask is aligned with the contour substrate. Alignments are made through multiple stages of yaw alignment, axial alignment and longitudinal alignment. Once the mask is aligned with contour substrate it is then subjected while rotating to developing field, such as uniform illumination of ultraviolet light shining on the side of the contour substrate as it is rotated in the illumination field. The developed photoresist layer disposed on the surface of the contour substrate is thus developed and the underlying film etched according to the patterned mask in a manner similar to a conventional planar photolithography. Multiple layers are thus disposed masked and etched to result in complex multilayered integrated circuit and/or microelectromechanical devices disposed on the contour surface of a macromechanical substrate or device.

Photolithography

To transfer a pattern onto a cylinder, according to the invention, photoresist, which is disposed directly onto the cylinder, is masked by a flexible sheet material which itself is patterned metal thin film. The desired pattern is defined on the sheet material or mask using conventional planar photolithographic techniques. The flexible patterned sheet material or mask is wrapped onto the cylinder. The photoresist on the cylinder is then exposed to ultraviolet light or another source of energy to develop the exposed areas of the photoresist to transfer the pattern from the flexible sheet material or mask to the cylinder.

Figure 1B:
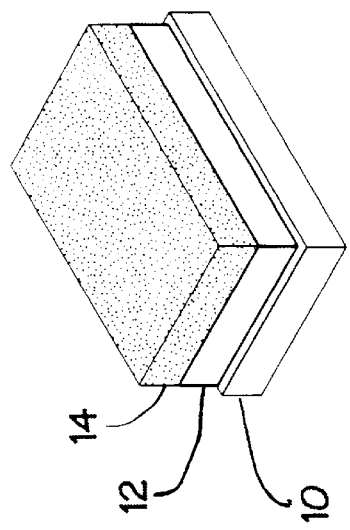
FIGS. 1(a)–(d) are perspective diagrammatic depictions showing the method of preparing the flexible patterning mask using conventional planar photolithography.
Figure 1D:
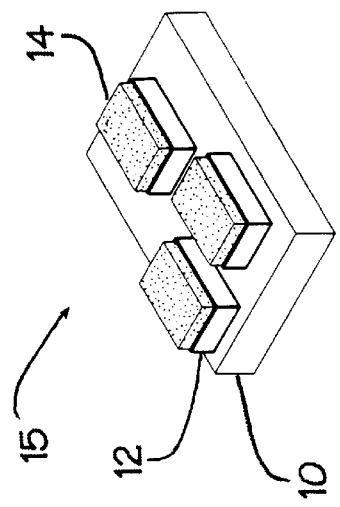
Figure 1A:
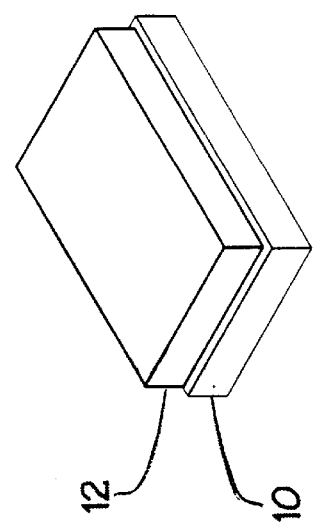
Figure 1C:
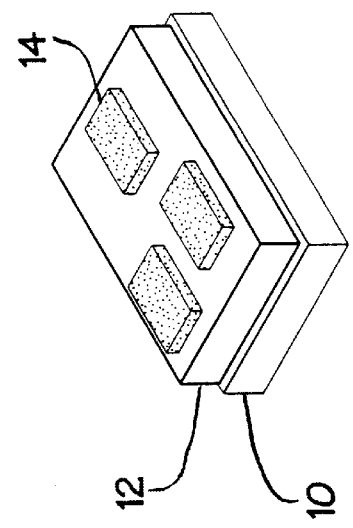

This basic approach is attractive due to its simplicity, good resolution, relatively cheap cost, and high through-put for image transfer. FIGS. 1(a)–(d) illustrate the basic steps in the production of the flexible mask. In FIG. 1(a) a metal film 12 is evaporated onto a flexible transparency 10 configured in a planar configuration. Photoresist 14 is then spun onto metal film 12 as shown in FIG. 1(b) while flexible transparency 10 is still configured in a planar configuration. Photoresist 14 is then patterned with a conventional high resolution mask while the flexible transparency 10 is still configured in a planar configuration as shown in FIG. 1(c). Unmasked portions of metal film 12 as are etched away to form a metal mask pattern on flexible film 10. The patterned mask, generally denoted by reference numeral 15, and each of its various component parts is thin enough and malleable enough to be bent to the shape of the cylinder without cracking. Mask 15 is now ready to be wrapped and aligned onto the photoresist coated cylinder as described below.

Photoresist Coating On the Contour Surface

Figure 2:
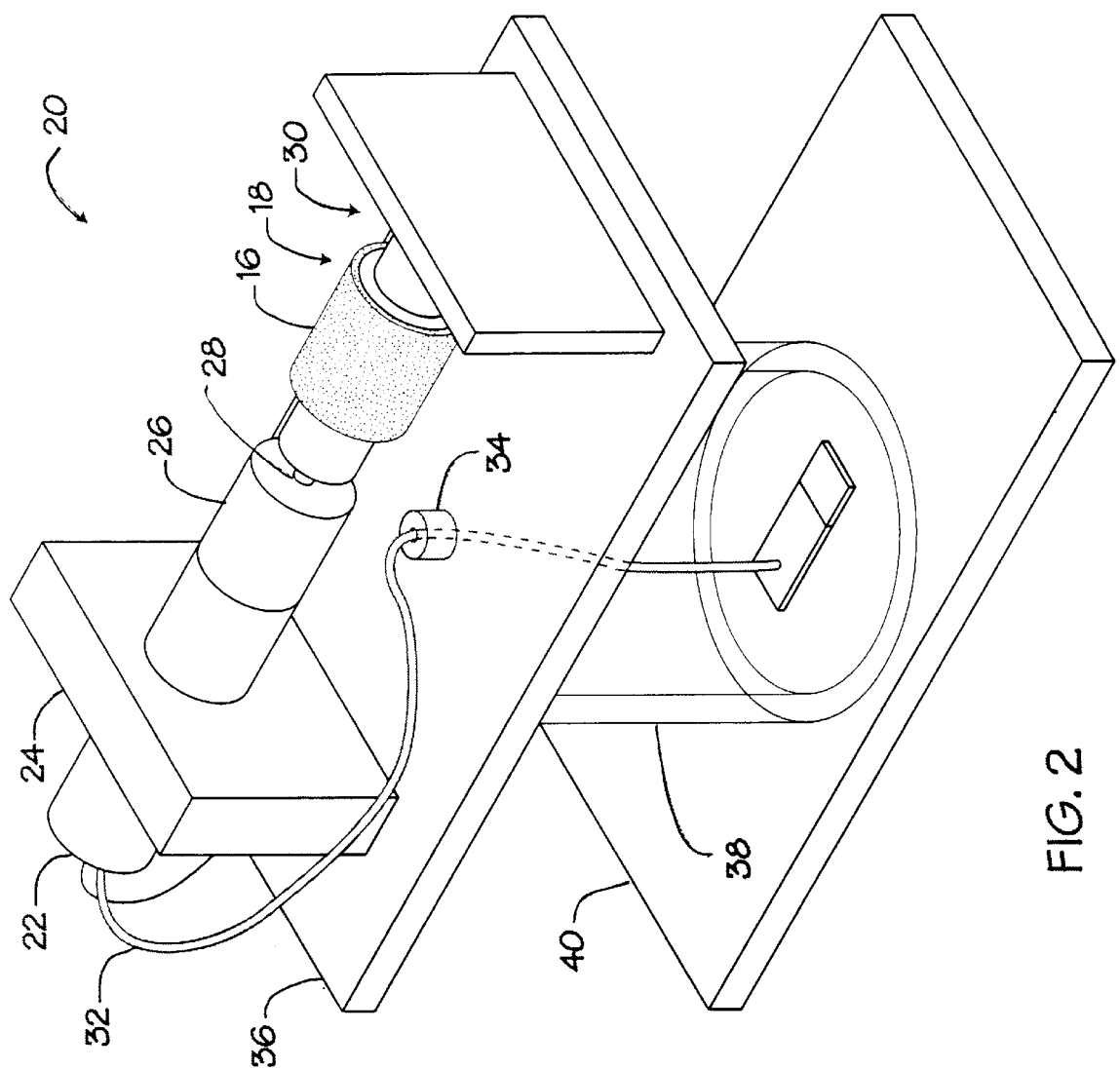
FIG. 2 is a simplified perspective illustration of a rotationer of the invention used for thin film depositions and mask exposures on a contour substrate which is a cylinder.

Photoresist coating 16 is applied to contour surface 18 as shown in FIG. 2 preferably by either of three methods. First, photoresist coating 16 may be spray coated on cylinder 18. Spray coating has the advantage in that it can be implemented in a standard clean room environment with a low cost system. Spray coating is also adaptable for coating contour surfaces of arbitrary shapes. Further, spray coating can achieve pattern resolutions comparable to spin coating, which is conventionally used to coat planar substrates in integrated circuit processes. By spraying photoresist on cylinder 18 and prebaking it at the appropriate temperature and time, it can then be exposed to ultraviolet light while rotating it for one minute. The photoresist then developed in AZ 400K developer with a 4:1 solution of AZ 400K to deionized water. Two micron photoresist structures are thereby obtainable on the cylinder.

Second, vacuum, vapor deposit organic films and plasma enhanced chemical vapor deposition carbon-based polymer films have been developed for use in all dry photolithographic processes. See V. E. Agabekoov, et al., "*Vacuum Photoresists on the Base of Phenoxazine and their Lithographic Properties,*" SPIE Vol. 2438, pp. 889–899 (1995). Vacuum vapor deposit thin film is based on benzophenoxzaine derivatives in a pressure range of $10^{-6}$ to $10^{-5}$ Torr are known. The evaporation temperature of the source is about 250° C. and the substrates, quartz, silicon or silica, are kept at ambient temperature. Typical thin film thicknesses of about half a micron were achieved and patternable with the laser at a wavelength 266 nanometers with an exposure dose of about 1 Joule/cm$^2$. Negative and positive plasma enhanced chemical vapor deposition carbon based resist films can be padded using a 193 manometer Micrascan system sold by Lithography Systems Inc. of Connecticut with a dose of about 58 miliJoules/cm$^2$. Submicron thick photoresist resolutions are achievable using this technique. Use of such a vacuum deposition allows uniform resist films to be deposited on a cylindrical substrate.

Third, photoresist coating 16 can be electrodeposited. Shipley's 2100 ED and 2400 PEPR electrodeposition photoresist, manufactured by Shipley Company Inc. of Massachusetts can be used to coat substrates 18. Electrodeposition photoresists have been shown to conformally cover highly textured surfaces. See S. Linder, et al., "*Photolithography in Anisotropically Etched Grooves,*" Proceedings of the 9$^{th}$ Annual International Workshop on MEMS, pp. 38–43 1996.

After a photoresist coating 16 has been disposed uniformly on cylinder 18 the process continues by patterning the photoresist through the use of a rotationer, generally denoted by reference numeral 20 and shown in FIG. 2. FIG. 2 is a perspective view of a rotationer built for use according to the present invention. Flexible mask 15 as fabricated in FIGS. 1(a)–(b) is then disposed upon cylinder 18 in FIG. 2. Exposure levels, durations and rotation rates are variable according to the particular application at hand in order to obtain sufficient fixation of the exposed photoresist. The use of patterned flexible mask 10 in combination with a sprayed photoresist layer 16 and the rotation exposure system 20 has been demonstrated that two micron structures can be obtained upon a cylindrical substrate 18. What has now been achieved is a single layer of patterning on cylindrical substrate 18 or alternatively on a thin film disposed on cylindrical substrate 18.

The rotationer of FIG. 2 comprises a vacuum proof motor 22 connected to a motor housing 24 having at its output a planetary gear transmission 26. The output of transmission 26 is coupled to a spindle 28 which engages cylinder 18 on center. The opposing end of cylinder 18 is supported on center by a cylinder support 30. The entire assembly 22–30 is sized and designed for disposition within a thin film vacuum deposition chamber. Motor 22 rotates cylinder 18 and a predetermined speed selected according to the motor design and transmission 26 to expose rotating cylinder 18 to the active elements of the film deposition apparatus (not shown). Motor 22 is coupled by cable 32 to a vacuum feedthrough 34. The entire assembly including vacuum feedthrough 34 is mounted on a base plate 36 disposed upon a vacuum proof chamber 38. Chamber 38 is provided to contain any nonvacuum proof components such as batteries or circuitry which may be required for the operation of rotationer 20. Chamber 38 in turn is mounted on an adapter 40 which is fitted into the thin film vacuum deposition chamber.

Thin Film Deposition

The patterning process for a single mask now having been described above consider the methodology for deposition of thin films onto cylindrical substrate 18. Typically, if substrate 18 is a macromachined element it will be composed of a metal or insulator. The integrated circuits and MEMS structures will be formed in a composite semiconductor, metal and insulative structure disposed as multiple thin films on substrate 18.

First, spray coating a thin film is possible with dielectrics such as polyimide and silicon dioxide, since they exist in liquid form and have almost the same viscosity as photoresist. Therefore the conventional photoresist spray technologies and apparatus described in this patent can also be used for spraying these types of dielectric materials onto contour substrates, typically in combination with rotation system 20 described in FIG. 2.

Second, electroplating of metal, such as nickel, can also be used to uniformly deposit thin layer on a contour substrate. The electroplating apparatus can be designed according to well understood design principles to uniformly deposit an electroplated layer on contour substrate 18, including but not limited to rotation of contour substrate 18 during the electroplating process.

Third, deposition of submicron thin films onto substrates can be achieved by the evaporation or sputtering of source materials. Metals such as aluminum, gold, platinum, titanium, and chromium are standard source materials for electron-beam or thermal evaporators. Amorphous silicon, silicon dioxide, and other oxides can also be electron-beam evaporated. Chemical vapor deposition and electron cyclotron resonance (ECR) techniques can be used to deposit amorphous silicon, $Si_xN_y$, and silicon dioxide thin films onto contour substrates. The deposition rates for all of the aforementioned techniques are typically of the order of atomic monolayer thicknesses of about one angstrom per second. As a consequence highly uniform films can be deposited onto the substrate 18 if it is rotated at one rps.

Consider the problem of alignment of multiple patterns from different thin film layers on a contour substrate. The means and methodology by which a thin film is deposited on a contour surface having now been described, photoresist 16 is then deposited on the contour thin film and masked by a flexible patterned mask 15 to produce a first patterned layer. Alignment on contour surface of the second mask and pattern is relatively difficult because, for example, in a cylindrical system there are two degrees of freedom. FIGS. 3(a) and (b) show a perspective diagrammatic view of a rotational stage 42 attached to cylinder 18 and a translational stage 46 attached to flexible mask 10 to provide alignment in two directions. In other words, cylinder 18 is attached to rotational stage or manipulator 42 which is capable of controllably rotating cylinder 18 about axis 44. Meanwhile, flexible substrate 10 is wrapped around cylinder 18 but slidable with respect to it, is coupled to translational stage 46 which is capable of moving flexible substrate 10 along the linear axis 48.

Figure 3:
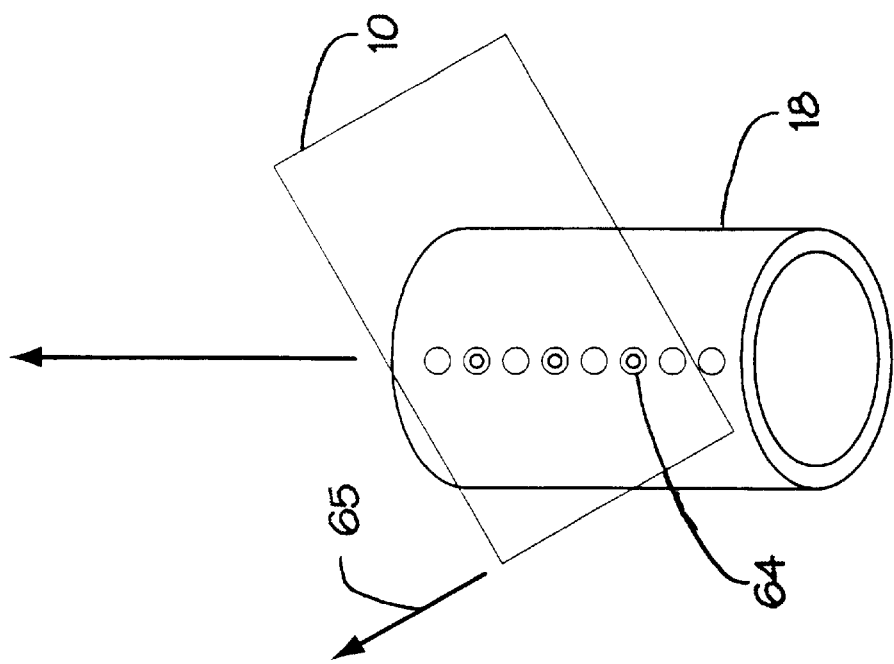
FIG. 3(a) is a simplified perspective illustration of an axial and longitudinal alignment system used for a contour substrate which is a cylinder.
FIG. 3(b) is a simplified perspective illustration showing yaw misalignment of a mask relative to a contour substrate which is a cylinder.
Figure 3:
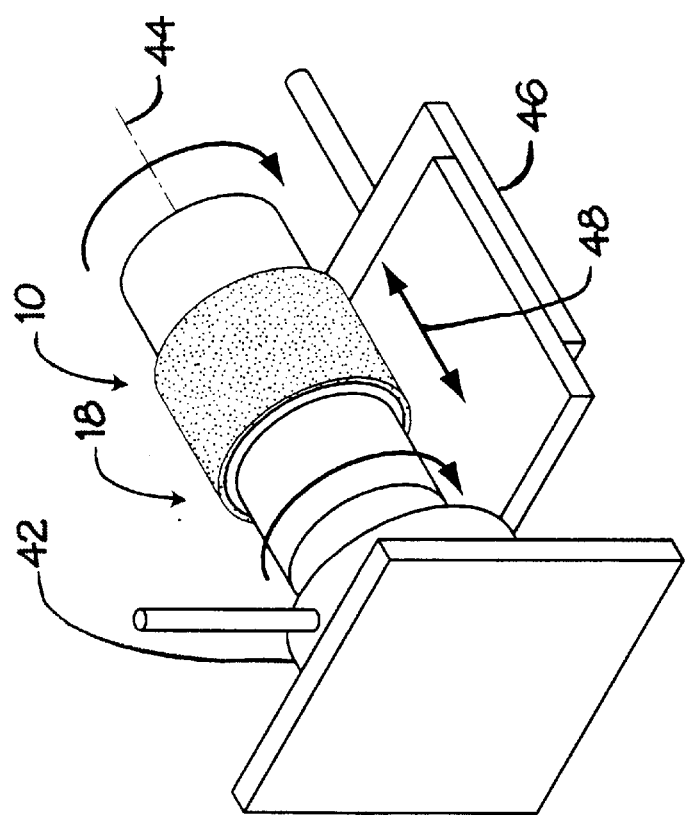
Figure 4:
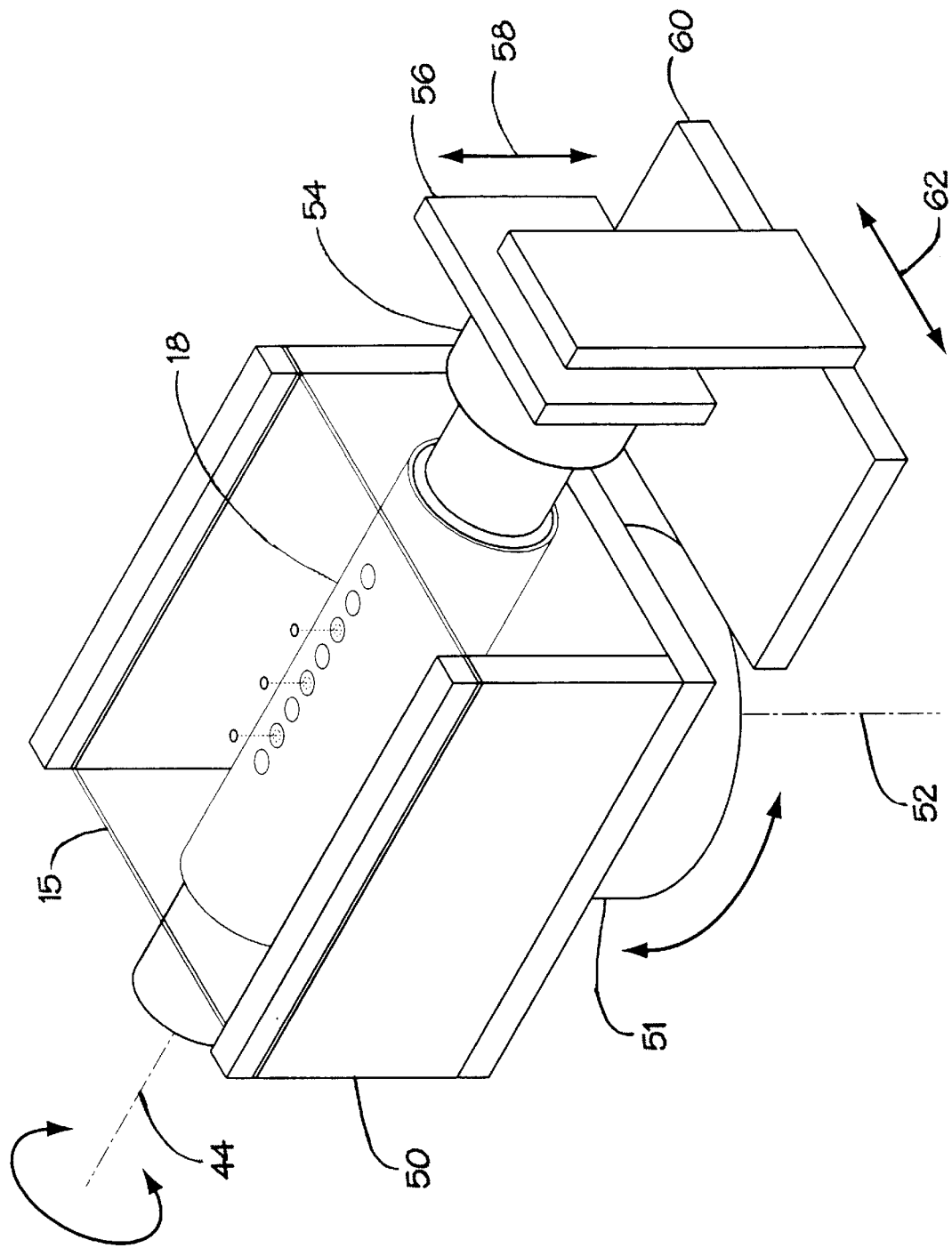
FIG. 4 is a simplified perspective illustration of a yaw alignment system used for a contour substrate which is a cylinder.

FIG. 3(b) illustrates, however, that yaw misalignment between mask 15 and cylinder 18 is still possible as illustrated by the misalignment of indicia markings 64 from axis 65. Therefore, the use of the system of FIG. 4 is first required. FIG. 4 is a simplified perspective view of yaw alignment system. Mask 15, having a second or later defined pattern defined thereon, is held in a jig 50 over cylinder 18. Jig 50 can be rotated about a vertical axis 52 perpendicular to mask 15 and to longitudinal axis 44 of cylinder 18. Cylinder 18 in turn is rotatable about its longitudinal axis 44 by means of a rotational stage 54. Rotational stage 54 in turn is mounted on a translational stage 56. Translational stage 56 provides for linear translation in the vertical axis 58. Translational stage 56 in turn is mounted on a second translational stage 60 to provide for linear translation in a horizontal perpendicular axis 62. In the system of FIG. 4 translational stage 56 is used to bring the cylinder adjacent or close to mask 15. Rotational stage 54 and translational stage 60 are then manipulated to position alignment marks 64 shown in FIG. 3(b) adjacent to similar marks defined on mask 15 or visa versa. At this point the underlying layers will be masked from view either by one or more newly deposited thin films or a new layer of photoresist. Alignment is thus typically made relative to specially defined and unmasked indicia marks on cylinder 18. Rotational stage 51 is then manipulated to eliminate any detected yaw misalignment. Once the indicia patterns are aligned, mask 15 is mechanically secured to cylinder 18 and then mask 15 and cylinder 18 are transferred to the alignment system of FIG. 3 for proper axial and azimuthal alignment with any preexisting pattern or indicia included in a previously defined layer on cylinder 18. Processing of the second or later layer can now continue with micron alignment assured.

The methodology of the invention is capable of inexpensively producing integrated circuit and MEMS devices on contour substrates. Many of the problems faced by designers in packaging flat IC/MEMS devices on contour substrates is avoided. The level of integration between micro sensors, actuators, circuits and macro mechanical parts is possible to a degree never before thought achievable. As a minimum, the methodology allows physical quantities to be measured with spatial resolutions heretofore unachieved, and at best the methodology is expected to create new commercial products that will revolutionize the techniques of interaction between machines and humans, namely giving rise to the possibility of having macromechanical transducers coupled to directly or intimately into biological systems.

What has been described above has been a method of mask fabrication and alignment on a contour surface. Using this method IC/MEMS devices of any design now known or later devised can be fabricated on the contour surface. The fabrication of the actual device comprises a series of steps of fabricating the flexible mask and then making the structure from the flexible mask on the contour surface.

A simplified description of making the flexible mask is as follows:

1. Preclean the flexible substrate or mask with appropriate chemicals.
2. Secure the flexible substrate to a solid-base substrate.
3. Deposit appropriate non-ultraviolet transparent thin films onto the flexible substrate.
4. Spin-coat, prebake, and selectively UV expose with patterns the photoresist on the flexible substrate.
5. Develop the photoresist in developer.
6. Postbake the prepared flexible substrate and chemically etch the thin films to obtain the desired patterns on the flexible substrate which becomes a flexible mask.

Having then made the flexible mask, the corresponding structure on the contour substrate can be made as follows:

1. Preclean the substrate with appropriate chemicals.
2. Deposit appropriate thin films onto the contour substrate.
3. Spray-coat photoresist onto the contour substrate.
4. Prebake the photoresist.
5. Conform the flexible mask to the contour substrate.
6. UV expose the photoresist while rotating the contour substrate.
7. Develop the photoresist in developer.
8. Postbake the photoresist.
9. Etch the thin films appropriately to define structures on the contour surface.
10. For alignment of another structural layer, repeat steps 1 to 4 above, and then use a customized alignment system to conform and align the desired mask to the patterns on the contour surface. Steps 6 to 9 are then used to complete the process for the desired structural layer. This process is then repeated for each new structural layer.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A method for fabricating micron or less sized devices onto a contoured surface of a substrate comprising:

fabricating a patterned mask on a surface of a flexible film while said flexible film is in a flat condition to provide a flexible mask;

disposing a photoresist layer onto said contoured surface of said substrate;

aligning said patterned mask conformally on said contoured surface of said substrate; and exposing said mask and said photoresist on said contoured surface of said substrate to a developing field of energy so that selected portions of said photoresist on said contoured surface of said substrate are developed thereby transferring a pattern from said patterned mask to said photoresist layer on said contoured surface of said substrate.

2. The method of claim 1 wherein fabricating said flexible mask comprises fabricating a patterned non-ultraviolet transparent layer on said flexible substrate.

3. The method of claim 2 wherein said non-ultraviolet transparent layer is a thin film of chromium disposed on said flexible substrate overcoated with a thin film of gold.

4. The method of claim 1 wherein said photoresist layer is disposed on said contoured surface of said substrate by spray coating said photoresist onto said contoured surface of said substrate.

5. The method of claim 1 where disposing said photoresist on said contoured surface of said substrate comprises electrodepositing a photoresist layer onto said contoured surface of said substrate.

6. The method of claim 1 wherein said contoured surface of said substrate is cylindrical and is characterized by a longitudinal axis, and exposing said contoured surface of said substrate to a developing field of energy comprises rotating said cylindrical contoured surface of said substrate about said longitudinal axis while exposing said cylindrical contoured surface of said substrate from a direction generally perpendicular to said longitudinal axis.

7. The method of claim 1 further comprising disposing a thin film on said contoured surface of said substrate prior to disposing said photoresist onto said contoured surface of said substrate, said photoresist thereafter being disposed on said thin film.

8. The method of claim 7 wherein said thin film is spray coated onto said contoured surface of said substrate.

9. The method of claim 7 wherein said thin film is electroplated onto said contoured surface of said substrate.

10. The method of claim 7 wherein said thin film is vapor/plasma deposited onto said contoured surface of said substrate.

11. The method of claim 7 wherein said thin film is disposed on said substrate while rotating said substrate.

12. The method of claim 1 where aligning said flexible mask to said contoured surface of said substrate is comprised of yaw aligning said mask to said contoured surface of said substrate;

temporarily affixing said flexible mask to said substrate after being yaw aligned; and longitudinally and axially aligning said mask to said substrate.

13. The method of claim 12 wherein yaw aligning said mask to said substrate is performed in a first yaw alignment system and wherein longitudinally and axially aligning said mask to substrate is performed in a second alignment system with two-degrees of freedom, yaw aligning being performed prior to longitudinally and axially aligning said mask to said contoured surface of said substrate in said second alignment system.

14. The method of claim 12 wherein yaw aligning said contoured surface of said surface relative to said flexible mask comprises translationally aligning said contoured surface of said substrate to a predetermined alignment indicia on said flexible mask;

rotationally aligning said contoured surface of said substrate to said indicia position on said flexible mask by rotation of said contoured surface of said substrate about an axis parallel to said plane of said mask; and rotationally aligning said flexible mask relative to said contoured surface of said substrate by rotating said flexible mask about an axis perpendicular to said first axis.

15. A method for fabricating an integrated circuit/microelectromechanical (IC/MEMS) structure on a surface of a cylindrical substrate comprising:

disposing a thin film on said surface of said cylindrical substrate by rotating said cylindrical substrate while said thin film is disposed thereon;

providing an aligned pattern on said thin film of said cylindrical substrate, which pattern is formed by use of a flexible mask which is fabricated while substantially flat and curved to conform to said cylindrical substrate; and exposing said aligned pattern on said thin film of said cylindrical substrate while rotating said cylindrical substrate to selectively define said IC/MEMS structure in said thin film on said cylindrical substrate surface.

16. The method of claim 15 where providing said aligned pattern on said thin film comprises disposing an aligned flexible mask on said thin film.

17. The method of claim 16 where aligning said flexible mask to said surface of said cylindrical substrate is comprised of yaw aligning said mask to said contoured surface of said cylindrical substrate;

temporarily affixing said flexible mask to said cylindrical substrate after being yaw aligned; and longitudinally and axially aligning said mask to said cylindrical substrate.

18. The method of claim 17 wherein yaw aligning said mask to said cylindrical substrate is formed in a first yaw alignment system and longitudinally and axially aligning said mask to cylindrical substrate is performed in a second alignment system having two degrees of freedom, yaw aligning being performed prior to longitudinally and then axially aligning said mask to said surface of said cylindrical substrate.

19. The method of claim 17 wherein yaw aligning said surface of said cylindrical substrate relative to said flexible mask comprises:

translationally aligning said surface of said cylindrical substrate to a predetermined alignment indicia on said flexible mask;

rotationally aligning said surface of said cylindrical substrate to said indicia position on said flexible mask by rotation of said surface of said cylindrical substrate about a first axis parallel to said plane of said mask; and rotationally aligning said flexible mask relative to said surface of said cylindrical substrate by rotating said flexible mask about an axis perpendicular to said first axis.

* * * * *